United States Patent [19]

Chen

[11] Patent Number: 4,970,779

[45] Date of Patent: Nov. 20, 1990

[54] REMOVER FOR IC CHIPS

[76] Inventor: Ing-Wen Chen, No. 3, Lane 57, Min-Tzu Rd., Hsin-Chu City, Taiwan

[21] Appl. No.: 409,322

[22] Filed: Sep. 19, 1989

[51] Int. Cl.⁵ .............................................. H05K 13/04
[52] U.S. Cl. ......................................... 29/764; 29/758
[58] Field of Search ...................... 29/764, 741, 426.5, 29/758

[56] References Cited

U.S. PATENT DOCUMENTS 3,699,629 10/1972 Hood, Jr. et al. ..................... 29/764
4,583,287 4/1986 McDevitt et al. ................. 29/764 X Primary Examiner—Carl E. Hall
Attorney, Agent, or Firm—Leonard Bloom

[57] ABSTRACT

A device for removing IC chips from a PC board. The device includes a hold unit, a rectangular base, an adjusting member and a jaw unit. The hold unit and the jaw unit are pivotally joined to the rectangular base. The adjusting member is vertically disposed through the base for vertical upward and downward movement through the rectangular base. The length of the adjusting member can be adjusted in order to adjust the length of the jaw unit so as to accomodate the size of the IC chip to be removed by gripping of the hold unit and jaw unit.

10 Claims, 4 Drawing Sheets

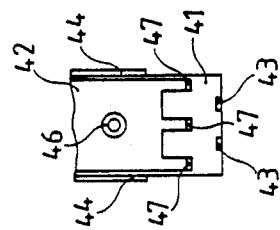
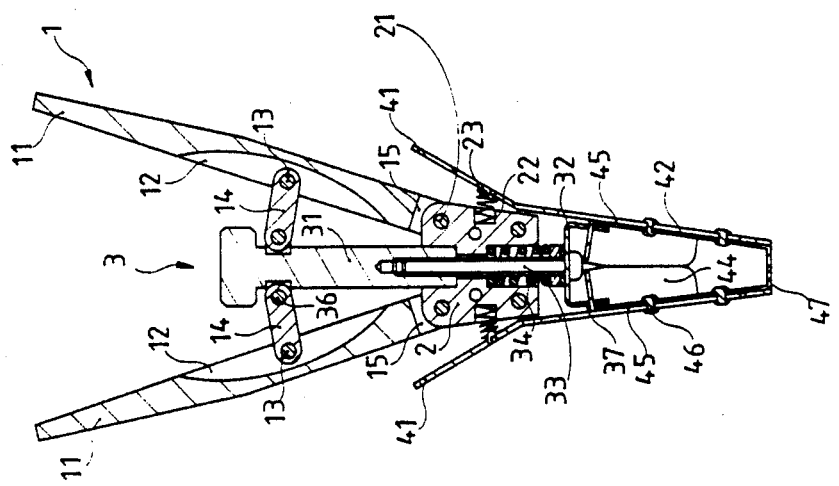

REMOVER FOR IC CHIPS

FIELD OF THE INVENTION

The present invention relates to a remover for IC chips and, more particulary, to a remover that is adjustable to the size of the IC chips to be unplugged, so that the IC chips may be rapidly and stably unplugged from a PC board, so as to not possibly cause any damage to the pins thereof.

BACKGROUND OF THE INVENTION

Generally speaking, to change IC chips on a PC Board, a computer serviceman melts the solder tin and then unplugs the IC chip either by hand or by prying with a flat head screw-driver. However, it is not convenient to unplug such IC chips with one's hand when the solder tin is hot, thereby affecting one's work efficiency. The prying of IC chips by use of a screw-driver may distort and break the pins of the IC chips. A traditional IC chip remover tong, as shown in FIG. 5, has been disclosed to aid in removing such chips. A grab bar 6 of this device is provided to grasp two short sides of the IC chips and, upon grasping the IC chip with said grab bar, the circular protection cover 7 is moved upward to unplug the chip. Unfortunately, such a device may not firmly clip smaller IC chips very securely and, in addition, if it is used on an electronic form (design) having a compact layout of IC chips, it can not stretch its grab hook 61 into the crevice (space) between the IC chips, so that the device has not been widely used.

SUMMARY OF THE INVENTION

One object of the present invention is to provide a remover for IC chips that is suitable for removing IC chips of various sizes.

Another object of the present invention is to provide a remover for IC chips that can steadily remove an IC chip by means of its pin junction.

Still another object of the present invention is to provide a remover for IC chips that allows an IC chip to be rapidly removed while avoiding any damage to its pins due to pressure exerted thereon by the grasping.

Techniques, elements and its effects for the above, and other objects of the present invention, shall be better understood from the following descriptions when taken in conjunction with the accompanying drawings in which preferred embodiments of the present invention are shown by means of illustrative examples.

BRIEF DESCRIPTION OF THE DRAWINGS

FIG. 2 is a cross-section view of the present invention, showing a layout of various elements.

FIG. 3 is an enlarged view of the claw unit, showing the arrangement of the various claws.

DESCRIPTION OF THE PREFERRED EMBODIMENT

Figure 1:
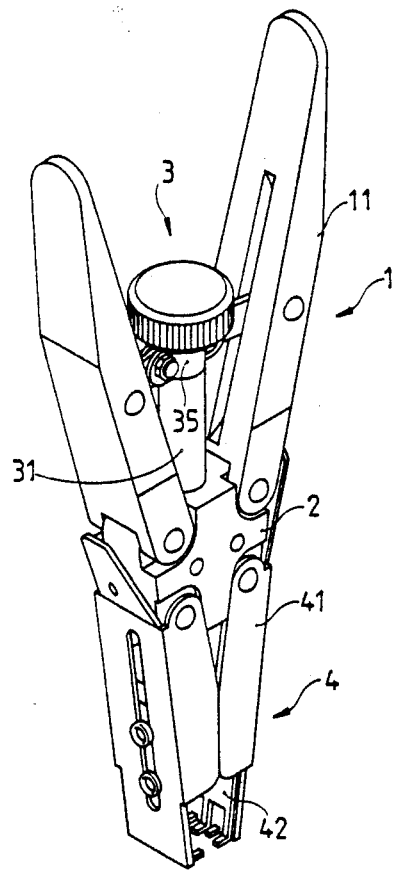
FIG. 1 is a perspective view of the present invention.

Referring now to the drawings, the device of the present invention comprises a hold unit 1, a rectangular base 2 having a top end and a bottom end, an adjusting member 3 and a jaw unit 4. The hold unit 1 and the jaw unit 4 are both pivoted on the rectangular base 2 and the adjusting member 3 is vertically removably received through the rectangular base 2 for vertical movement in an upward direction and in an opposite downward direction. The structures and functions relating to the present invention will now be illustrated below.

As shown in FIGS. 1-3, the hold unit 1 has a pair of handles 11. The internal side of each handle is longitudinal milled, so that a slot way 12 is formed therein. The top end of each handle 11 has an arc shape and its middle section is bent or curved, so as to define an outwardly-flared portion to facilitate the holding thereof. The middle section of each handle 11 has a rivet 13 disposed therethrough for pivotally connecting respective connection sheets (struts) 14 to the handles 11 in the slot ways 12 thereof, the bottom end of each said handle 11 has an U-notch 15 formed therein for pivotally joining the handles 11 to the top end of the base 2 for pivotal movement of the top ends of the handles 11 in a first direction towards one another and in a second direction away from one another.

The base 2 resembles a rectangular block having horizontal pivot holes formed in the four corners thereof and through which are disposed respective rivets (pivot shafts) 21. The pivot shafts are provided to join the handles 11 of the hold unit 1 and the jaw unit 4 to the base 2. Two opposite lateral faces on the base 2 each has a respective circular groove (blind ended bore) 22 formed therein into which are inserted respective helical springs 23, each spring 23 further being located to bear against the outwardly-flared portions of the top ends of a respective first jaw of the jaw unit 4. The base 2 has a vertical bore formed therethrough through which the adjusting member 3 is vertically removably received, to control the vertical movement of the jaw unit 4 to pull the IC chip.

The adjusting member 3 includes an adjusting rod (shaft) 31 disposed extending through the vertical bore in the base 2 for the vertical movement, a pull plate 32, a screw 33 for joining the adjusting rod 31 and the pull plate 32, and a spring 34 disposed in the vertical bore between the base 2 and the shaft, surrounding the adjusting screw 33 for constantly resiliently biasing the shaft in the first upward direction. The top end of the adjusting rod 31 extends outwardly from the top end of the base and is fitted with two lock sheets (a collar) 35, and said lock sheets are joined to the connection sheets 14 of the hold unit by means of screws 36. In this fashion, the handles 11 are operatively connected to the shaft, so that gripping and movement of the two handles in the first direction towards one another moves the adjusting rod 31 upwardly. The bottom portion (bottom end) of the adjusting rod 31 extends outwardly from the bottom end of the base and has internal spiral teeth formed thereon. The long screw 33 is joined to the pull plate 32, so that the screw 33 and the plate 32 are moved upward and fastened in place by the adjusting rod 31. As soon as the adjusting rod 31 is moved upward, it concommittantly upwardly moves the pull plate 32 therewith for hooking (gripping) IC chips at various different heights. The pull plate 32 is U shape and both end faces thereof extend downward and each has a strip hole 37 formed therein, so as to accomodate the jaw unit 4 in order to pull and move the jaw unit 4.

The jaw unit 4 includes a pair of fixtures (first jaws) 41 and a pair of rectangular grab sheets (second jaws) 42 and, in which the top end of each fixture (first jaw) 41 is pivoted (pivotally joined) to the base 2 for pivotal movement of the first jaws in a first direction and in a second opposite direction. The top end of each fixture 41 includes an upper end that extends upward and outward therefrom and from both sides of the base 2. On the bottom end of the inward side of each fixture 41, extending inwardly therefrom, are several parallel outer claws (claw teeth) 43. Both ends near the middle section on the internal side of each fixture 41 is provided with a long sheet (flange) 44, so as to define a slot way. Each fixture 41 has a slender hole (slot) 45 formed therein to slidably join with a respective grab sheet 42 by means of rivets 46 carried by the sheets 42 that extend through the slender hole 45, so that each grab sheet 42 is located internally of a respective fixture 41 for pivotally moving therewith in the first and second opposite direction and is permitted to slidably move up and down within the slot way defined by the sheets 44 of each fixture 41. The top of each grab sheet 42 is operatively connected to the bottom end of the shaft by extending inward and being received through the strip hole 37 of the pull plate 32, so that the pull plate 32 moves the grab sheet 42 up and down therewith concommittantly with, and in response to, the movement of the shaft. The bottom of each grab sheet 42 extends inward therefrom forming several parallel inner claws (claw teeth) 47. Each inner claw 47 is alternated with the outer claw (claw teeth) 43 of each fixture 41, and the pitch between each two claws 47 is 5.08 m/m in accordance with the standard pitch for the pins of IC chip at 2.54 m/m, i.e. the pitch between two adjoined claw hooks is equal to the distance of three pins of an IC chip. The pitch between each inner claw 47 and the adjoined outer claw 43 is 2.54 m/m. As soon as the IC chips are unplugged (removed) by the claw hook, said claws may easily stretch into the crevice of pins to firmly grab the IC chips.

Figure 4:
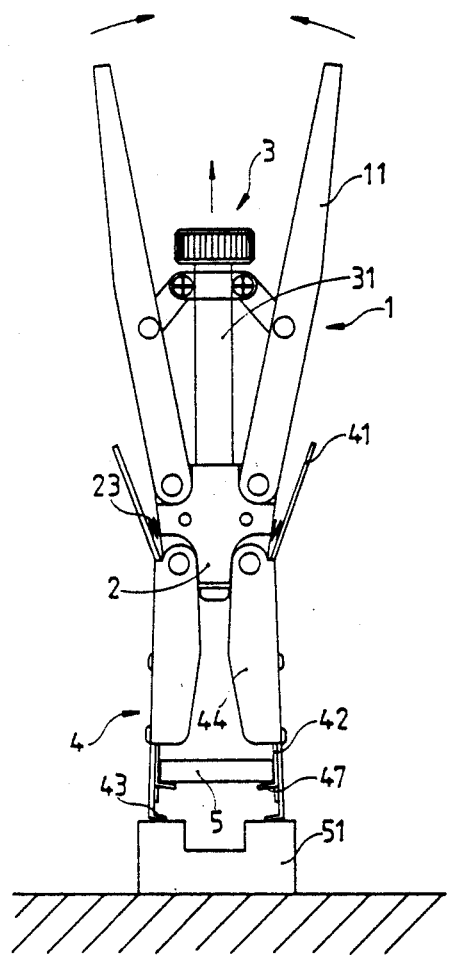
FIG. 4 illustrates the device in use to remove an IC chip from an IC base (a PC board).
Figure 5:
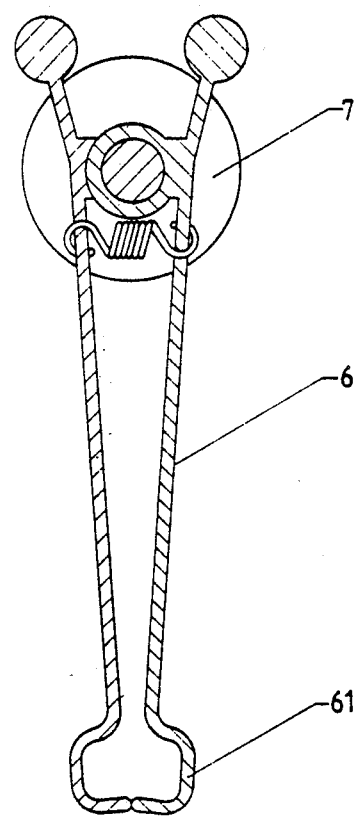
FIG. 5 is a transverse sectional view of a traditional device for removing an IC chip.

As shown in FIG. 4, for operating the remover according to the present invention, the extension length of grab sheet 42 can be adjusted according to the specifications of IC chips 5 to be removed and then be pressed to hold and overcome the biasing action of the springs 23, moving the jaws in the second direction, so that the top end of the fixtures 41 of the jaw unit are pivoted in the second direction, wherein the bottom ends of the fixtures (first jaws) 41 and the grab sheets (second jaws) 42 move away from one another and easily extend out stretching into two side faces of the IC chip 5. As soon as the claws 43 and the grab sheets (second jaws) of the fixture 41 is pressed down upon an IC socket 51, the bottom end of the fixtures 41 and the grab sheets 42 are pivoted in the first direction, wherein the bottom ends of the fixtures (first jaws) move towards one another for gripping the IC chips, so that it will close owing to the elasticity (resilient biasing action) of springs 23 and the fixtures 41 and grab sheets 42 have already taken-up (removed) the IC chip 5. The claws 47 of the grab sheet 42 extends into the bottom face of the IC chip 5 and, upon pressing, holds the hold unit 1, thereby raising the adjusting member 3 and the claws 42 and pulling the IC chip out rapidly. The IC chip remains clamped or gripped firmly within the jaw unit 4 without any risk of dropping or inclining. Also, if a chip should contain concentrated electronic parts thereon, the jaw unit 4 still permits extending to the bottom side of the IC chip in a smooth way. Therefore, the chance of the pins of the IC chip being damaged by, for example, a violent tensile motion during removal shall never been possibily found in the present invention. The chip may then be released by moving the jaw unit in the second direction, as discussed above.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. A device for removing IC chips, comprising:
   a rectangular base including a bottom end and a top end having a pair of horizontal pivot holes formed therein, the base further having a vertical bore formed therethrough:
   a pair of pivot shafts, each pivot shaft being disposed through and carried by a respective pivot hole formed in the top end of the base:
   a pair of handles, each handle being joined to a respective pivot shaft for pivotally joining the handles to the top end of the base:
   an adjusting member including an adjusting rod disposed extending through the vertical bore formed in the base for vertical movement in an upward direction and in an opposite downward direction:
   a jaw unit including respective pairs of fixtures and grab sheets, the fixtures being pivotally joined to the bottom end of the base, the fixtures including respective upper ends that extend upwardly and outwardly therefrom and respective bottom ends including outer claws that extend inwardly therefrom, the grab sheets being located internally of the respective fixtures and including a bottom end that has parallel inner claws that extend inwardly therefrom:
   the adjoined pitch between the inner claws of each respective grab sheet is approximately two times greater than the distances between two adjoined pins of an IC chip, and the inner claws of each grab sheet are alternated with the outer claws of each fixture.

2. A device for removing IC chips from an IC board, comprised of:
   a base having a top end and a bottom end, the base further having a vertical bore formed therethrough;
   an adjusting member including a shaft having a top end and a bottom end, the shaft being vertically movably received through the vertical bore of the base with the bottom end of the shaft extending outwardly from the bottom end of the base and with the top end of the shaft extending outwardly from the top end of the base, so that the shaft is vertically movable through the bore in a first upward direction and in a second opposite downward direction;
   a pair of first jaws having respective top ends and bottom ends, the top ends of the first jaws being pivotally joined to the bottom end of the base for pivotal movement of the first jaws in a first direction, wherein the bottom ends of the first jaws move towards one another for gripping the IC chips and in a second opposite direction, wherein the bottom ends of the first jaws move away from one another for releasing the IC chips;
   a pair of second jaws having respective top ends and bottom ends, the second jaws being pivotally moveable in a first direction, wherein the bottom ends thereof move towards one another for gripping IC chips and in a second opposite direction, wherein the bottom ends thereof move away from one another for releasing the IC chips, the top ends of the second jaws being operatively connected to the bottom end of the shaft for concommittant vertical movement therewith in the first upward direction for removing the IC chip and in a second opposite downward direction in response to the movement of the shaft; and the first jaws and the second jaws each terminating in respective claw teeth, all of the jaws and claw teeth being substantially parallel to one another.

3. The device of claim 2, further comprised of:

means disposed between the base and the shaft for constantly resiliently biasing the shaft in the first upward direction.

4. The device of claim 3, wherein the means is includes a spring disposed in the vertical bore of the base surrounding the shaft.

5. The device of claim 2, further comprised of:

means disposed between the base and the pair of the first jaws for constantly resiliently biasing the first jaws in the first inward direction.

6. The device of claim 5, wherein the means is comprised of:

a pair of blind ended bores formed in the base on opposite sides thereof, a spring disposed in each respective bore, so as to be disposed between and bearing against the base and the top end of the respective first jaws.

7. The device of claim 5, further comprised of:

the top end of each first jaw including outwardly-flared positions for being manually gripped, said outwardly-flared portions located overlying the means for constantly biasing the first jaws, such that the means for constantly biasing the first jaws is overcome and the first and second jaws are moved in the second direction.

8. The device of claim 2, further comprised of:

each of the second jaws being slidably joined to a respective first jaw for slidable movement of the second jaws, so that movement of the first jaws in the first and second directions thereof concommittantly moves the second jaws therewith.

9. The device of claim 2, further including a pair of handles having respective top and bottom ends, the bottom ends of each of said handles being pivotally joined to the top end of the base for pivotal movement of the top ends of the handles in a first direction towards one another and in a second opposite direction away from one another, each of the handles being operatively connected to the shaft, so that movement of the handles in the first direction moves the shaft in the upward direction for removing the IC chips.

10. The device of claim 2, wherein the claw teeth of the first jaws are spaced so as to be alternated with the claw teeth of the second jaws.

* * * * *